United States Patent
McElroy et al.

(10) Patent No.: US 7,129,457 B2
(45) Date of Patent: Oct. 31, 2006

(54) REDUNDANT IMAGING SYSTEMS

(75) Inventors: David J. McElroy, Livingston, TX (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/868,131

(22) Filed: Jun. 15, 2004

(65) Prior Publication Data

US 2004/0222355 A1 Nov. 11, 2004

Related U.S. Application Data

(62) Division of application No. 09/650,551, filed on Aug. 30, 2000, now Pat. No. 6,756,576.

(51) Int. Cl.
*H01L 21/00* (2006.01)
*H04N 9/64* (2006.01)

(52) U.S. Cl. .............................. 250/208.1; 250/214 A; 348/246

(58) Field of Classification Search ............. 250/208.1, 250/214 A; 348/246, 247, 229.1, 230.1
See application file for complete search history.

(56) References Cited

U.S. PATENT DOCUMENTS 3,906,389 A 9/1975 Matsumoto et al.

4,481,539 A * 11/1984 Meise et al. ................ 348/247
4,589,028 A 5/1986 Ochi (Continued)

FOREIGN PATENT DOCUMENTS

JP 05091419 A * 4/1993

OTHER PUBLICATIONS

Toshiba, "Toshiba develops ¼ inch 330,000 pixel image sensor utilizing common CMOS process technology," Feb. 5, 1997.*

(Continued)

*Primary Examiner*—Thanh X. Luu
(74) *Attorney, Agent, or Firm*—Schwegman, Lundberg, Woessner & Kluth, P.A.

(57) ABSTRACT

Imaging arrays typically include thousands or millions of photodetectors that convert sensed light into corresponding electric signals, which are ultimately converted into digital image signals for recording or viewing. One problem with conventional imaging arrays concerns faulty photodetectors, which produce erroneous image signals that ultimately degrade the quality of resulting images. Accordingly, the present inventors devised new imaging arrays including redundant photodetectors to compensate for faulty ones. One exemplary embodiment includes photodetectors that are substantially smaller than conventional photodetectors and that are arranged into two or more groups, with the photodetectors in each group coupled to produce a single group image signal. If the group image signal for a group falls below some threshold level indicative of a defective or malfunctioning photodetector, the group image signal is amplified to compensate for the loss.

13 Claims, 3 Drawing Sheets

U.S. PATENT DOCUMENTS

| | | | |
|---|---|---|---|
| 5,291,293 A | 3/1994 | Kapan | |
| 5,635,700 A | 6/1997 | Fazekas | 235/472 |
| 5,854,655 A | 12/1998 | Watanabe et al. | 348/247 |
| 5,995,675 A | 11/1999 | Hwang | |
| 6,133,563 A | 10/2000 | Clark et al. | |
| 6,184,752 B1 | 2/2001 | Dautriche | 330/278 |
| 6,201,234 B1 | 3/2001 | Chow et al. | 250/214 LS |
| 6,219,468 B1 | 4/2001 | Yukawa et al. | 382/312 |
| RE37,282 E | 7/2001 | Smitt | |
| 6,756,576 B1 * | 6/2004 | McElroy et al. | 250/208.1 |
| 6,806,902 B1 * | 10/2004 | Donovan | 348/246 |
| 2004/0222356 A1 | 11/2004 | McElroy et al. | |

OTHER PUBLICATIONS

Toshiba, "Toshiba launches CMOS image sensor ICs that realize CCD quality images," Jan. 23, 2002.*

Fossum, E. R., "CMOS Image Sensors: Electronic Camera On A Chip", *IEDM*, (1995),pp. 17-24.

Fossum, E. R., "CMOS Image Sensors: Electronic Camera-On-A-Chip", *IEEE Transactions on Electron Devices*, 44(10), (Oct. 1997),pp. 1689-1698.

Iida, Y , et al., "Study of Pixel Structure and Layout for CMOS Active Pixel Image Sensor", *SPIE*, 3001, (1998),pp. 158-167.

* cited by examiner

REDUNDANT IMAGING SYSTEMS

This application is a Divisional of U.S. application Ser. No. 09/650,551, which was filed Aug. 30, 2000, now U.S. Pat. No. 6,756,576 and which is incorporated herein by reference.

TECHNICAL FIELD

The present invention concerns imaging arrays and methods, particularly methods for correcting or compensating for defective or malfunctioning photodetectors in an imaging array.

BACKGROUND OF THE INVENTION

Imaging arrays are electronic devices that sense light and output electrical signals representative of the sensed light. The imaging arrays are generally coupled to a television screen, computer monitor, or digital camera, which displays or records an image based on the output electrical signals.

An imaging array often includes a rectangular array or matrix of thousands or even millions of photodetectors, with each photodetector having a unique row and column position within the array which corresponds to a particular region, known as a pixel, of a displayed image. Each photodetector (or sensor pixel) converts sensed light into corresponding electric signals based on the intensity of the light. The electrical signals are converted into digital signals, comprising ones and zeros, which are processed by a digital-signal-processing circuit. This circuit ultimately outputs image signals to a device for recording or viewing.

One problem with conventional imaging arrays concerns defective or malfunctioning photodetectors. Defective photodetectors typically result in erroneous image signals that ultimately degrade the quality of resulting images. For example, an image based on imaging signals from an imaging array having a defective photodetector can have a black or dark area at the image region corresponding to the defective photodetector.

One limited solution to this problem has been to identify the defective photodetector and to generate a substitute image signal for the image signal of the defective photodetector, with the substitute image signal based on an average of the image signals from detectors surrounding it. See, for example, U.S. Pat. No. 5,854,655 (which is incorporated herein by reference). However, this solution suffers from the disadvantage that the substitute image signal introduces artifacts into the resulting image. The artifacts reflect the complete loss of information about the light actually striking the relatively large area corresponding to the defective photodetector.

Accordingly, there is a need for other methods of handling defective photodetectors.

SUMMARY OF INVENTION

To address this and other problems, the present inventor devised new imaging arrays and related methods for compensating for defective photodetectors. One exemplary embodiment of a new imaging array includes two or more group photodetectors, or "group pixels," with each group pixel having two or more photodetectors coupled to produce a single group image signal. If the group image signal for a group pixel falls below some threshold level indicative of a defective or malfunctioning photodetector, the group image signal is amplified to compensate for the loss.

Various embodiments implement the photodetectors as passive or active photodiode circuits, as photogate circuits, as logarithmic sensor pixel circuits, or as charge-modulation devices. Some embodiments also implement the photodetectors as smaller-than-conventional photodetectors, that is, photodetectors having photosensing elements smaller than conventional elements.

DESCRIPTION OF THE PREFERRED EMBODIMENTS

Figure 1:
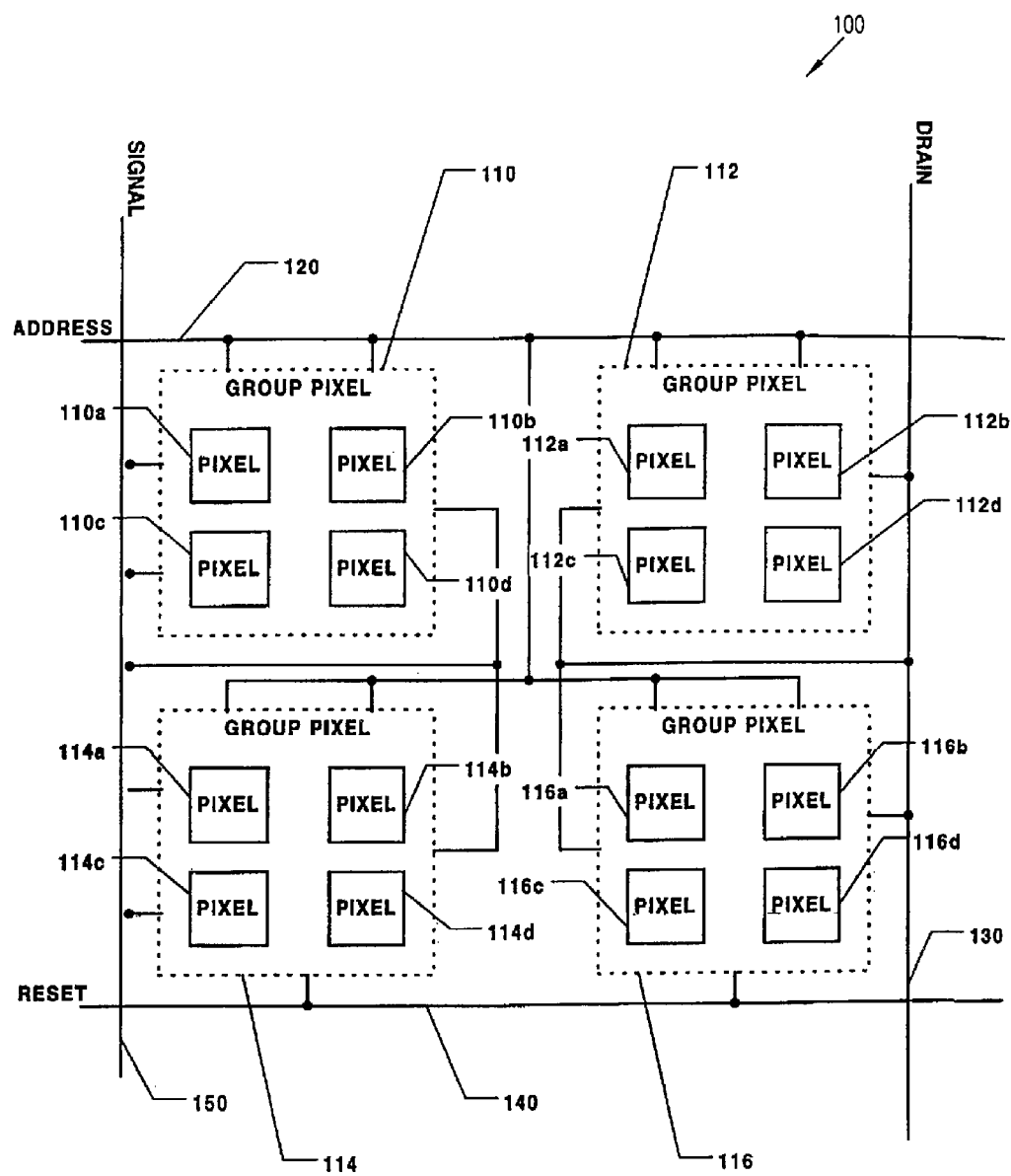
FIG. 1 is a block diagram of an exemplary imaging array 100 incorporating the invention.
Figure 2:
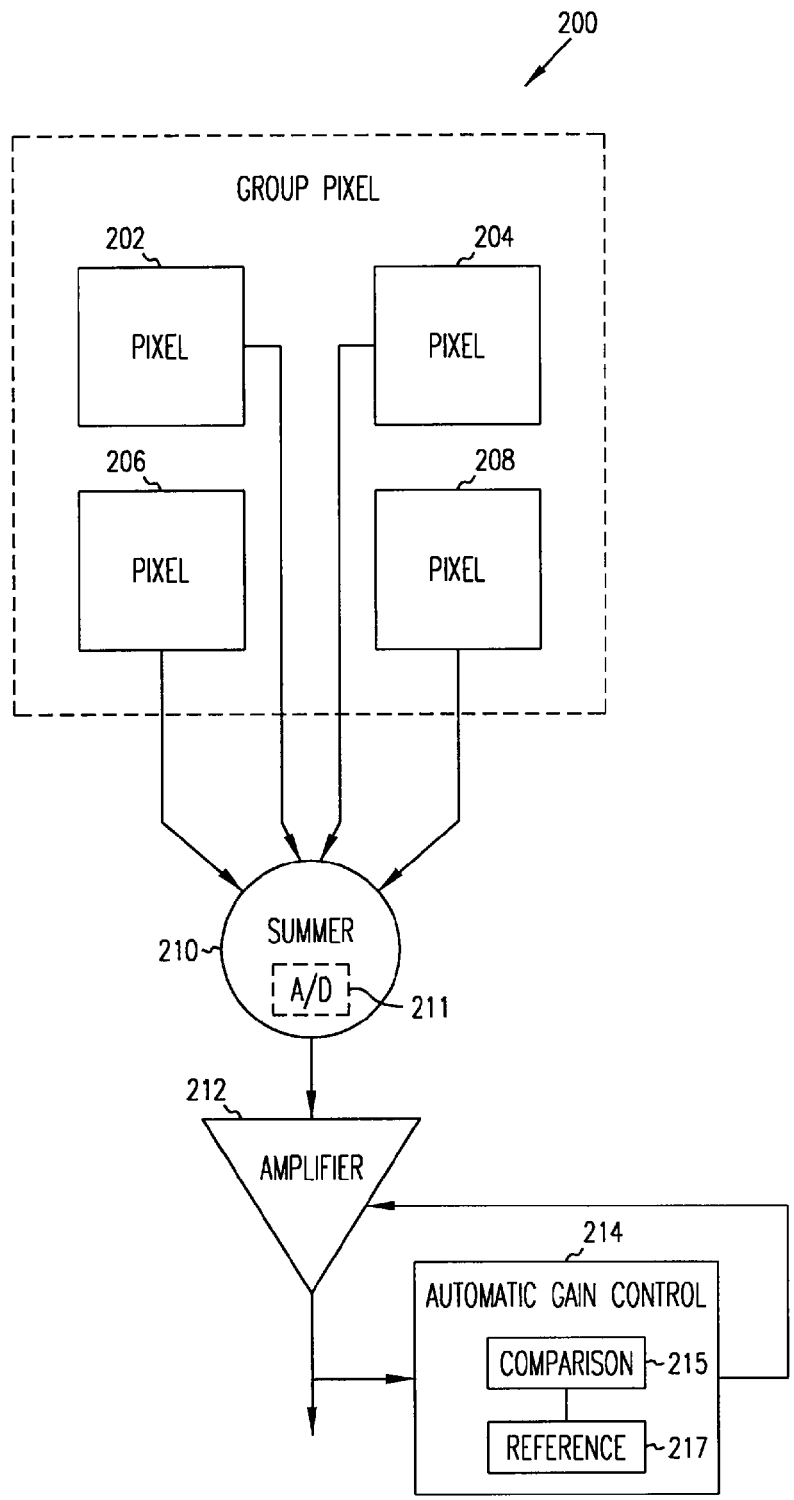
FIG. 2 is a block diagram of an exemplary group-pixel circuit 200 incorporating the present invention.
Figure 3:
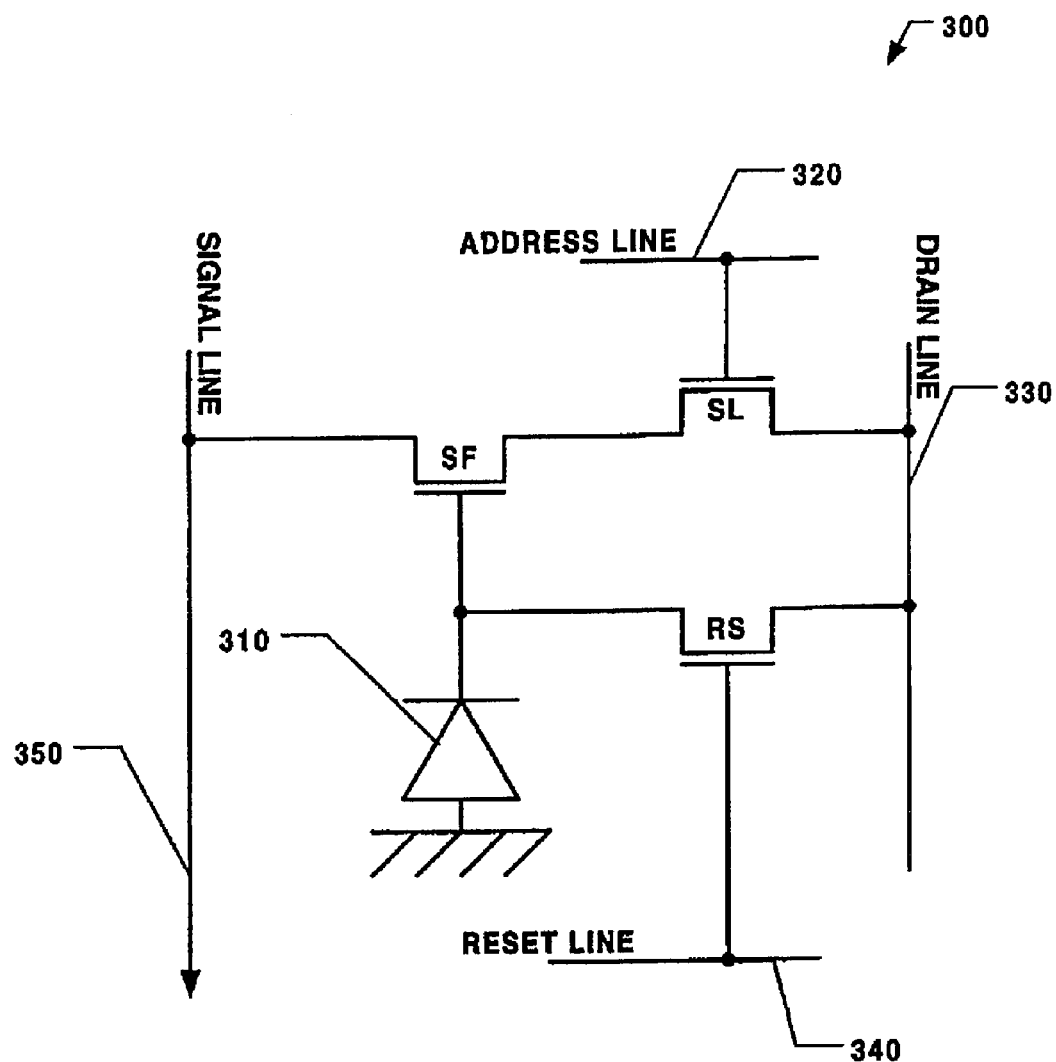
FIG. 3 is a block diagram of an exemplary pixel circuit 300.

The following detailed description, which references and incorporates FIGS. 1–3, describes and illustrates one or more specific embodiments of the invention. These embodiments, offered not to limit but only to exemplify and teach, are shown and described in sufficient detail to enable those skilled in the art to implement or practice the invention. Thus, where appropriate to avoid obscuring the invention, the description may omit certain information known to those of skill in the art.

FIG. 1 shows an exemplary imaging array 100 incorporating teachings of the present invention. Imaging array 100 includes group pixels 110, 112, 114, and 116, an address line 120, a drain line 130, a reset line 140, and a signal line 150. for controlling the group pixels. (For clarity, the figure omits conventional features, such as row-select logic, column-select logic, timing-and-control circuitry, and analog-to-digital converters.) In the exemplary embodiment, array 100 includes four group pixels; however, other embodiments include 256×256 arrays, 512×512 arrays, 1024×1024 arrays. Still larger arrays are also within the scope of the invention.

Each of group pixels 110–116 includes two or more photodetectors, or sensor pixels. Group pixel 110 includes sensor pixels 110a, 110b, 110c, and 110d, and group pixels 112, 114, and 116 include respective sensor pixels 112a–112d, 114a–114d, and 116a–116d. Lines 120, 130, and 140, in the exemplary embodiment, control the group pixel in accord with known techniques for addressing and controlling conventional sensor pixels in imaging arrays. In some embodiments, each group pixels provides a particular output color, such as red, blue, or green.

FIG. 2 shows a block diagram of an exemplary group-pixel circuit 200 applicable to each of group pixels 110–116 in FIG. 1. Circuit 200 includes N sensor pixels, of which sensor pixels 202, 204, 206, and 208 are representative, a summer 210, a variable-gain amplifier 212, and an automatic gain controller 214. The N pixels 202–206, which operate according to known principles, are coupled to an input of summer 208, either through direct connection or through a multiplexer (not shown). Some embodiments include one or more analog-to-digital converters coupled between the signal lines of the pixels and the summer, depending on whether summer 210 is analog or digital.

Summer 210 aggregates the N responses of the N pixels 202–206 and outputs a first aggregate or group image signal to amplifier 212. (Some embodiments include an analog-to-digital converter 211 between the summer and the amplifier.) Amplifier 212, which in some embodiments is analog and in others is digital, amplifies or scales the first group image signal and outputs a second group image signal to automatic gain controller 214 as well as to conventional imaging processing and display circuitry (not shown.) See U.S. Pat. No. 5,854,655, which is incorporated herein by reference.

Automatic gain controller 214, which is analog or digital, compares the second group image signal to an analog or digital reference current or voltage. If the comparison 215 indicates that the second group image signal differs from the reference 217, controller 212 proportionately changes, that is, increases or decreases, the gain of amplifier 210, assuming that one or more of the N pixels or related interconnective circuitry is faulty. In the exemplary embodiment, gain controller 214 sets the gain to a factor proportional to the ratio of N, the number of pixels comprising the group pixel to M, the number of correctly operating or non-faulty pixels in the group pixel.

To determine the number of non-faulty pixels, some embodiments, check the performance of each pixel in each group pixel as a start-up diagnostic test and maintain a record of the number of faulty or non-faulty pixels in each group pixel. Other embodiments dynamically or periodically determine a difference between the first aggregate image signal and a reference, and then determine from the difference how many pixels are faulty. The reference in some embodiments is based on a factory test image.

FIG. 3 shows an exemplary sensor pixel circuit 300 applicable to each of the pixels in FIGS. 1 and 2. Circuit 300, a photodiode-type active sensor pixel circuit, includes photodiode 310, a source-follower field-effect transistor SF, a row-select field-effect transistor SL, and a charge-reset field-effect transistor RS. (An n-channel load transistor for source-follower transistor SF is not shown.) Each field-effect transistor has respective gate, drain, and source nodes. The circuit further includes an address line 320, a drain line 330, a reset line 340, and a signal line 350.

In operation, a voltage develops across photodiode 310 based on incident light. Application of appropriate control signals on the gate of transistor SL produces an image signal on signal line 350 based on the voltage across the photodiode. Signal line 350 couples the image signal to an input node of an analog-to-digital converter or summer, such as summer 210 in FIG. 2.

Various embodiments implement the photodetectors as passive or active photodiode circuits, as photogate circuits, as logarithmic sensor pixel circuits, or as charge-modulation devices. (See, for example, Eric R. Fossum, CMOS Image Sensors: Electronic Camera-On-A-Chip, 1995 International Electron Devices Meeting Digest of Technical Papers, which is incorporated herein by reference.) Some embodiments each photodetector occupies a surface area less than 30 square microns, such as 15 or 25 square microns. Some of these embodiments have a fill factor greater than 30 percent. Thus, the present invention is not limited to any particular photodetector circuit or class of photodetector circuits.

CONCLUSION

In furtherance of the art, the inventors have presented new imaging arrays and related methods for compensating for defective photodetectors. One exemplary embodiment of a new imaging array includes one or more group pixel circuits, each of which comprises two or more photodetectors that are substantially smaller than conventional photodetectors, for example about 15 or 25 square microns. Each group pixel circuit produces a single group image signal. The group image signal is then scaled or amplified to compensate for defective or malfunctioning photodetectors.

The embodiments described above are intended only to illustrate and teach one or more ways of practicing or implementing the present invention, not to restrict its breadth or scope. The scope of the invention intended to encompass all ways of practicing or implementing the principles of the invention, is defined only by the following claims and their equivalents.

The invention claimed is:

1. An imaging system comprising:
a group pixel comprising two or more photodetectors for providing two or more corresponding pixel image signals;
a summer coupled to each of the two or more photodetectors for outputting an aggregate image signal based on the two or more corresponding pixel image signals;
a variable-gain amplifier responsive to the aggregate image signal for outputting an amplified aggregate image signal based on a gain; and
an automatic gain controller for adjusting the gain based on the aggregate image signal and a reference signal, wherein a difference between the aggregate image signal and the reference signal represents that the group pixel contains at least one faulty pixel.

2. The imaging system of claim 1 wherein the summer comprises an analog-to-digital converter.

3. The imaging system of claim 1, further comprising an address line and a signal line, with each photodetector coupled to the address line and the signal line.

4. The imaging system of claim 1, wherein each photodetector is adapted to detect one of red, green, and blue light.

5. The imaging system of claim 1, wherein the gain is based on a ratio of a total number of photodetectors in the group pixel to a total number of faulty photodetectors in the group pixel.

6. An imaging system comprising:
a group pixel comprising two or more photodetector circuits for providing two or more corresponding pixel image signals, with each photodetector circuit having a photodiode and occupying a surface area less than 50 square microns;
a summer coupled to each of the two or more photodetector circuits for outputting an aggregate image signal based on the two or more corresponding pixel image signals;
a variable-gain amplifier responsive to the aggregate image signal for outputting an amplified aggregate image signal based on a gain; and
an automatic gain controller for adjusting the gain based on the aggregate image signal, with the gain determined by comparing the amplified aggregate image signal to a reference signal the comparison representing that the group pixel contains at least one faulty pixel.

7. The imaging system of claim 6 wherein the summer comprises an analog-to-digital converter.

8. The imaging system of claim 6, further comprising an address line and a signal line, with each photodetector of the group pixel coupled to the address line and the signal line.

9. The imaging system of claim 6, wherein each photodetector is adapted to detect one of red, green, and blue light.

10. An imaging system comprising:
a group pixel comprising two or more photodetector circuits for providing two or more corresponding pixel image signals, wherein each photodetector circuit has a surface area less than 50 square microns, is adapted to detect the same color of light, and comprises:

a source-follower transistor having a gate, source, and drain;

a ground node; and a photodiode coupled between the gate of the source-follower transistor and the ground node;

a summer coupled to each of the two or more photodetector circuits for outputting an aggregate image signal based on the two or more corresponding pixel image signals;

a variable-gain amplifier responsive to the aggregate image signal for outputting an amplified aggregate image signal based on a gain; and an automatic gain controller for adjusting the gain based on the aggregate image signal, with the gain determined by comparing the amplified aggregate image signal to a reference signal the comparison representing that the group pixel contains at least one faulty pixel.

11. The imaging system of claim 10, wherein the gain is based on a ratio of a total number of photodetector circuits in the group pixel to a total number of faulty photodetector circuits in the group pixels.

12. The imaging system of claim 10 wherein the summer comprises an analog-to-digital converter.

13. The imaging system of claim 10, further comprising an address line and a signal line, with each photodetector circuit of the group pixel coupled to the address line and the signal line.

\* \* \* \* \*

UNITED STATES PATENT AND TRADEMARK OFFICE
CERTIFICATE OF CORRECTION

PATENT NO. : 7,129,457 B2 Page 1 of 1
APPLICATION NO. : 10/868131
DATED : October 31, 2006
INVENTOR(S) : McElroy et al.

It is certified that error appears in the above-identified patent and that said Letters Patent is hereby corrected as shown below:

On Title Page

On Page 2, in item (56); under "Other Publications", in column 2, line 9, delete "3001," and insert -- 3301, --, therefor.

Column 4, line 53, in Claim 6, before "the" insert -- , --.

Column 6, line 1, in Claim 10, before "the" insert -- , --.

Signed and Sealed this

Sixth Day of March, 2007

JON W. DUDAS
*Director of the United States Patent and Trademark Office*